United States Patent
Mei et al.

(10) Patent No.: US 8,399,268 B1
(45) Date of Patent: Mar. 19, 2013

(54) DEPOSITION OF PHOSPHOR ON DIE TOP USING DRY FILM PHOTORESIST

(75) Inventors: Zequn Mei, Fremont, CA (US); Xiantao Yan, Palo Alto, CA (US)

(73) Assignee: LedEngin, Inc., San Jose, CA (US)

( * ) Notice: Subject to any disclaimer, the term of this patent is extended or adjusted under 35 U.S.C. 154(b) by 0 days.

(21) Appl. No.: 13/338,936

(22) Filed: Dec. 28, 2011

(51) Int. Cl.
*H01L 21/00* (2006.01)

(52) U.S. Cl. ............... 438/22; 438/26; 438/28; 438/29; 438/99; 257/E21.032

(58) Field of Classification Search .............. 438/22, 438/26, 28, 29, 99; 257/E21.032
See application file for complete search history.

(56) References Cited

U.S. PATENT DOCUMENTS

| 6,682,331 B1 * | 1/2004 | Peh et al. ................. 425/112 |
| 7,049,159 B2 * | 5/2006 | Lowery ...................... 438/22 |
| 8,330,176 B2 * | 12/2012 | Thompson et al. ........... 257/98 |
| 2010/0181582 A1 * | 7/2010 | Li et al. ...................... 257/91 |

* cited by examiner

*Primary Examiner* — Michael Trinh
(74) *Attorney, Agent, or Firm* — Kilpatrick Townsend & Stockton LLP

(57) ABSTRACT

A method for depositing a layer of phosphor-containing material on a plurality of LED dies includes disposing a template with a plurality of openings on an adhesive tape and disposing each of a plurality of LED dies in one of the plurality of openings of the template. The method also includes forming a patterned dry film photoresist layer over the template and the plurality of LED dies. The photoresist layer has a plurality of openings configured to expose a top surface of each of the LED dies. Next, a phosphor-containing material is disposed on the exposed top surface of each the LED dies. The method further includes removing the photoresist layer and the template.

10 Claims, 11 Drawing Sheets

DEPOSITION OF PHOSPHOR ON DIE TOP USING DRY FILM PHOTORESIST

CROSS-REFERENCES TO RELATED APPLICATIONS

This application is related to concurrently-filed U.S. patent application Ser. No. 13/338,912, filed Dec. 28, 2011. Titled "DEPOSITION OF PHOSPHOR ON DIE TOP BY STENCIL PRINTING", commonly owned and incorporated herein by reference in its entirety.

BACKGROUND OF THE INVENTION

The present invention relates in general to light-emitting diodes (LEDs) and in particular to deposition of phosphor-containing material on LED dies for light color selection.

With the incandescent light bulb producing more heat than light, the world is eager for more efficient sources of artificial light. LEDs are a promising technology and are already widely deployed for specific purposes, such as traffic signals and flashlights. For colored light, an LED chip is often combined with a wavelength-converting material to obtain desired output light color. For example, yellow phosphors are often combined with blue LEDs to produce white light. However, the development of LED-based lamps for general illumination has run into various difficulties. Among these is the difficulty of mass-producing LED emitters with phosphors that provide a consistent light color.

Conventional LED emitters often include an LED die in a recess or cup structure that has phosphor-containing material in the cup. In some cases, the phosphor-containing material is separated from the LED die by, for example, a silicone material. These conventional methods tend suffer from many drawbacks. For example, conventional methods often use a large amount of phosphor, and they may cause poor cooling of the phosphor and the silicone material. As a result, the emitter can suffer from less reliable packaging and non-uniform angular distribution of light color. Given existing processes for LED manufacture, mass-producing white LEDs with a consistent color temperature has proven to be a challenge.

BRIEF SUMMARY OF THE INVENTION

Embodiments of the present invention relate to methods for placing controlled amount of phosphor-containing material on top of LED dies. In some embodiments, a plurality of LED dies are placed in openings of a template. The phosphor-containing material of suitable viscosity is applied, e.g., by printing, and then excess material is removed using the template as a guide. The size of the opening limits the phosphor-containing material to only the exposed top surface of the LED dies, and the height of the template help control the thickness of the phosphor-containing material. A patterned photoresist can be used to mask out areas of the die where no phosphor-containing material is desired.

The methods described herein have many advantages can be achieved over conventional techniques. The methods use conventional equipment and processes and are suitable for cost-effective mass production. The phosphor usage is reduced, since phosphor is placed only on the top surface of the LED die. Heat generated in the phosphor material can be dissipated through the LED die, and better cooling can reduce the temperature of the phosphor and the silicone material and lead to more reliable package. In contrast, a conventional method of placing phosphor on die top involves using a syringe to place liquid droplets of phosphor material. One drawback of this method is that the liquid mixture tends to settle and can lead to color shifting. In the methods according to the present invention, the mixture of phosphor-containing material is formed to desired viscosity before being applied to the template.

According to an embodiment, a method for depositing a layer of phosphor-containing material on a plurality of LED dies includes disposing a template with a plurality of openings on an adhesive tape and disposing each of a plurality of LED dies in one of the plurality of openings of the template. The method also includes disposing a patterned dry photoresist film over the template and the plurality of LED dies. The dry photoresist film has a plurality of openings configured to expose a top surface of each of the LED dies, but can shield surface areas for bonding pads, etc. Next, a phosphor-containing material is disposed on the exposed top surface of each the LED dies. The method further includes removing the dry photoresist film and the template.

In a specific embodiment of the above method, the adhesive tape is placed on a glass plate. The adhesive tape can be a heat release tape or a UV release tape. In some embodiments, the area of the openings in the template is approximately equal to the size of the LED dies. The thickness of the openings in the template is substantially equal to a thickness of the LED dies. In some embodiments, the dry photoresist film is configured to cover bond pad areas on the LED dies. In some embodiments, the method includes depositing the phosphor-containing material on the dry photoresist film and the LED dies and removing the phosphor-containing material from the top surface of the stencil and on the top surface of the LED dies that protrudes above the top surface of the dry photoresist film. In an embodiment, the thickness of the dry photoresist film is equal to a desired thickness of the phosphor-containing material.

A further understanding of the nature and advantages of the present invention may be more appreciated by reference to the detailed description in the remaining portions of the specification and accompanying drawings that follow.

BRIEF DESCRIPTION OF THE DRAWINGS

FIG. 1 shows a substrate for carrying out the method for phosphor deposition according to an embodiment of the present invention;

FIGS. 2 and 3 show a grid template for carrying out the method for phosphor deposition according to an embodiment of the present invention;

FIG. 4 illustrates the process of LED chips being placed into the grid openings of the template;

FIGS. 5(a)-5(c) illustrate the template openings being filled with LED chips and bond patterns on the LED chips;

FIG. 6 illustrates a mask layout that can be used in patterning a photoresist film;

FIG. 7 shows a dry film photoresist disposed over the template and the LED chips;

FIG. 8 illustrates a process of exposing dry film photoresist using a photomask;

FIG. 9 shows the patterned photoresist after a development process;

FIG. 10 shows that phosphor material deposited in openings of the photoresist patterns;

FIG. 11 shows curing the intermediate structure including a glass plate, a template over the plate, LED chips disposed in openings in the template, a photoresist pattern with a phosphor-containing mixture filling its openings and over the exposed top surface of the LED chips;

FIG. 12 shows the structure in FIG. 11 with the photoresist removed;

FIG. 13 shows a structure including a plurality of separate LED dies attached to an adhesive tape, each of the LED dies having a layer of phosphor-containing material on the top surface.

DETAILED DESCRIPTION OF THE INVENTION

The description below will be made with reference to a series of drawing figures enumerated above. These diagrams are merely an example, which examples, and should not unduly limit the scope of the claims herein. In connection with the various aspects illustrated and described, one of ordinary skill in the art would recognize other variations, modifications, and alternatives.

Figure 1:
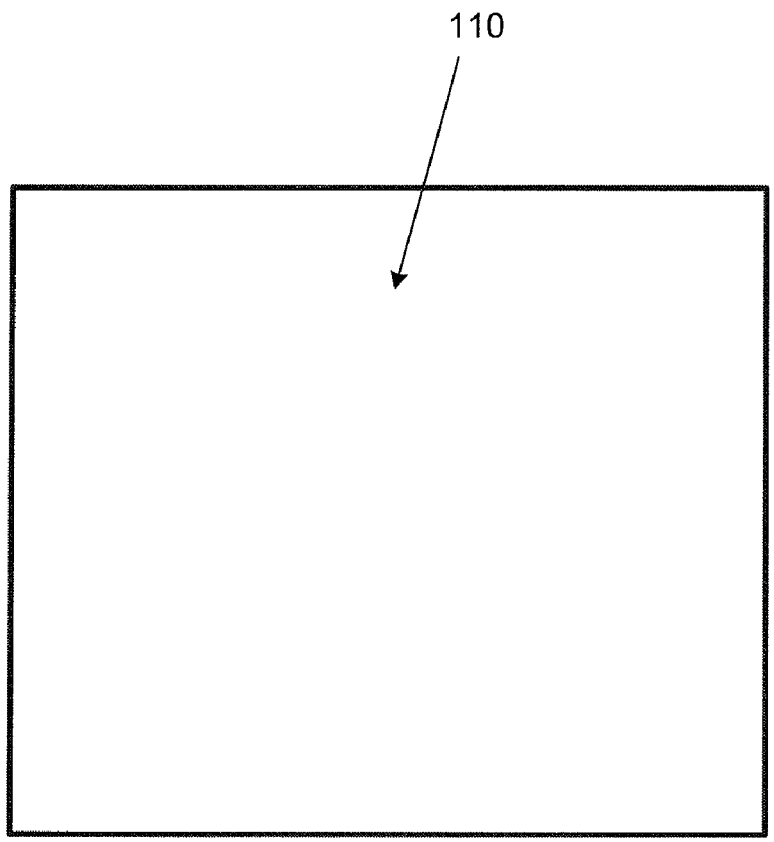
FIGS. 1-13 are cross-sectional diagrams illustrating a method for carrying out a method for phosphor deposition according to an embodiment of the present invention.
Figure 1:
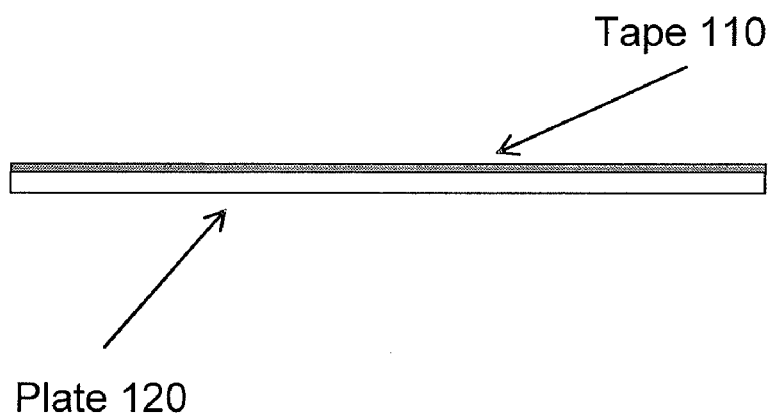

FIG. 1 shows a top view and a cross-sectional view of a substrate for carrying out the method for phosphor deposition. An adhesive tape 110 is disposed on a glass plate 120. In an embodiment, the tape a double-sided adhesive tape, which can be a thermal release or a UV release tape made of, e.g., polyester. For example, a commercially available tape from Semiconductor Equipment Corp. can be used. Tape 110 is attached to plate 120 the glass substrate. In a specific embodiment, plate 120 is about 1 mm thick. But plates having other suitable thicknesses can also be used.

Figure 2:
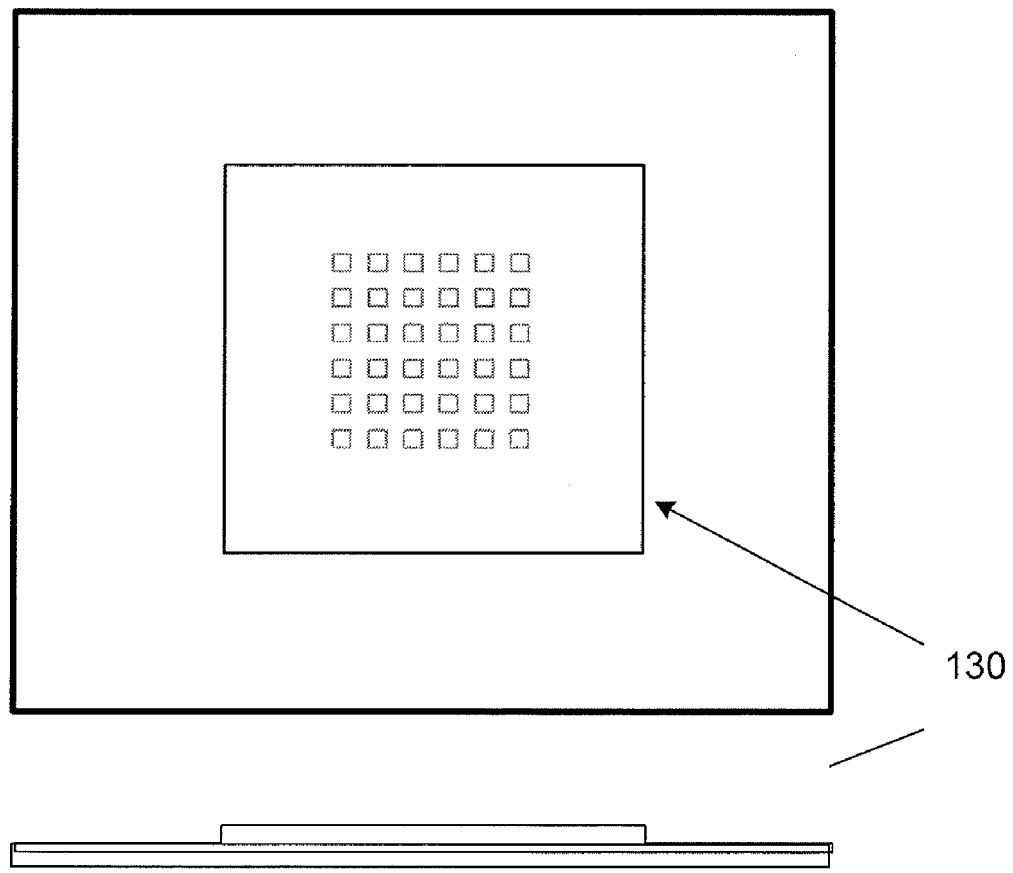
Figure 3:
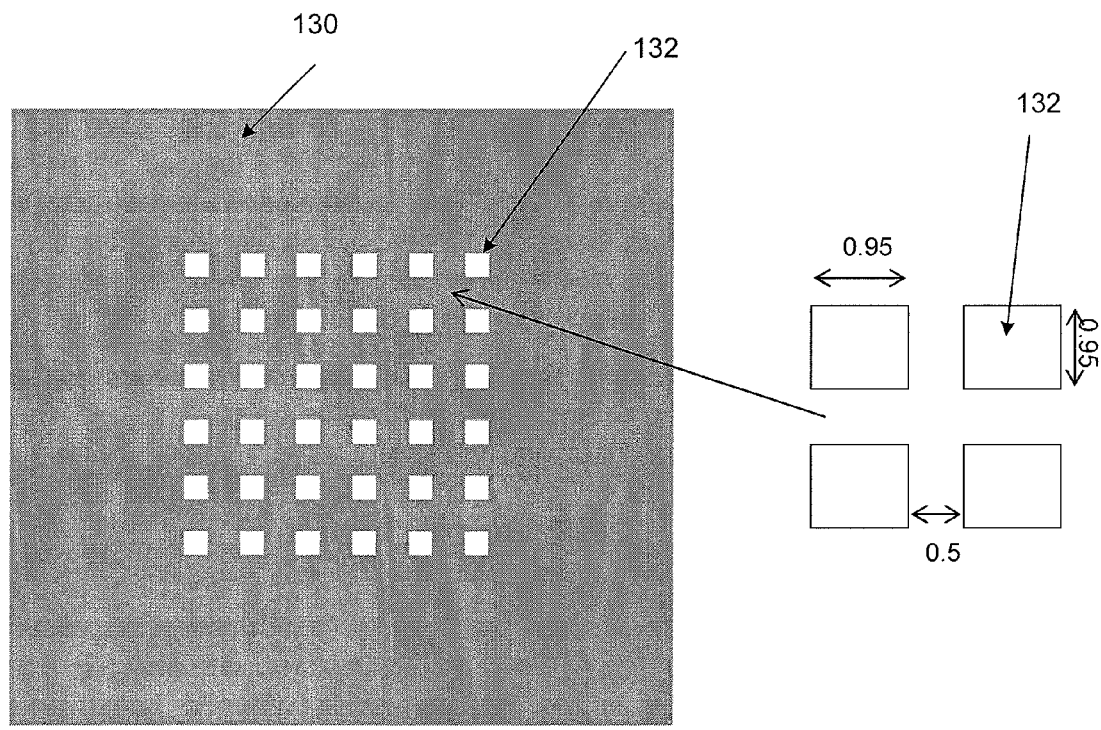

In FIG. 2, a grid template 130 is disposed on the adhesive top side of tape 110. In the example of FIG. 2, the grid template includes openings arranged in a 6×6 array. However, depending on the application, the grid template can have other grid patterns, e.g. 30×30. In some embodiments, the grid template is a metal plate with square openings. The opening is slightly larger than an LED chip size, and the plate thickness is the same as the LED chip thickness. A specific example of the template 130 is shown in FIG. 3, where the size of the opening 132 is 0.95 mm by 0.95 mm for an LED chip of size 0.9 mm by 0.9 mm. In this example, the spacing between openings is 0.5 mm, and the plate thickness is 0.17 mm. Of course, these dimensions can be varied.

Figure 4:
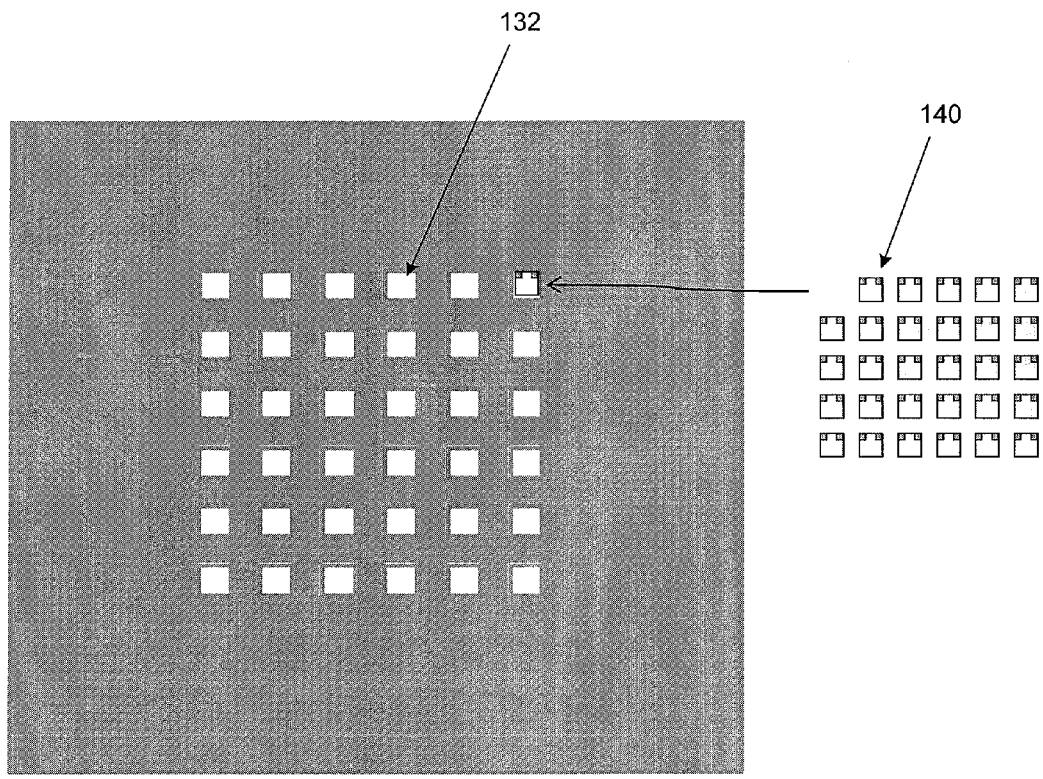
Figure 5:
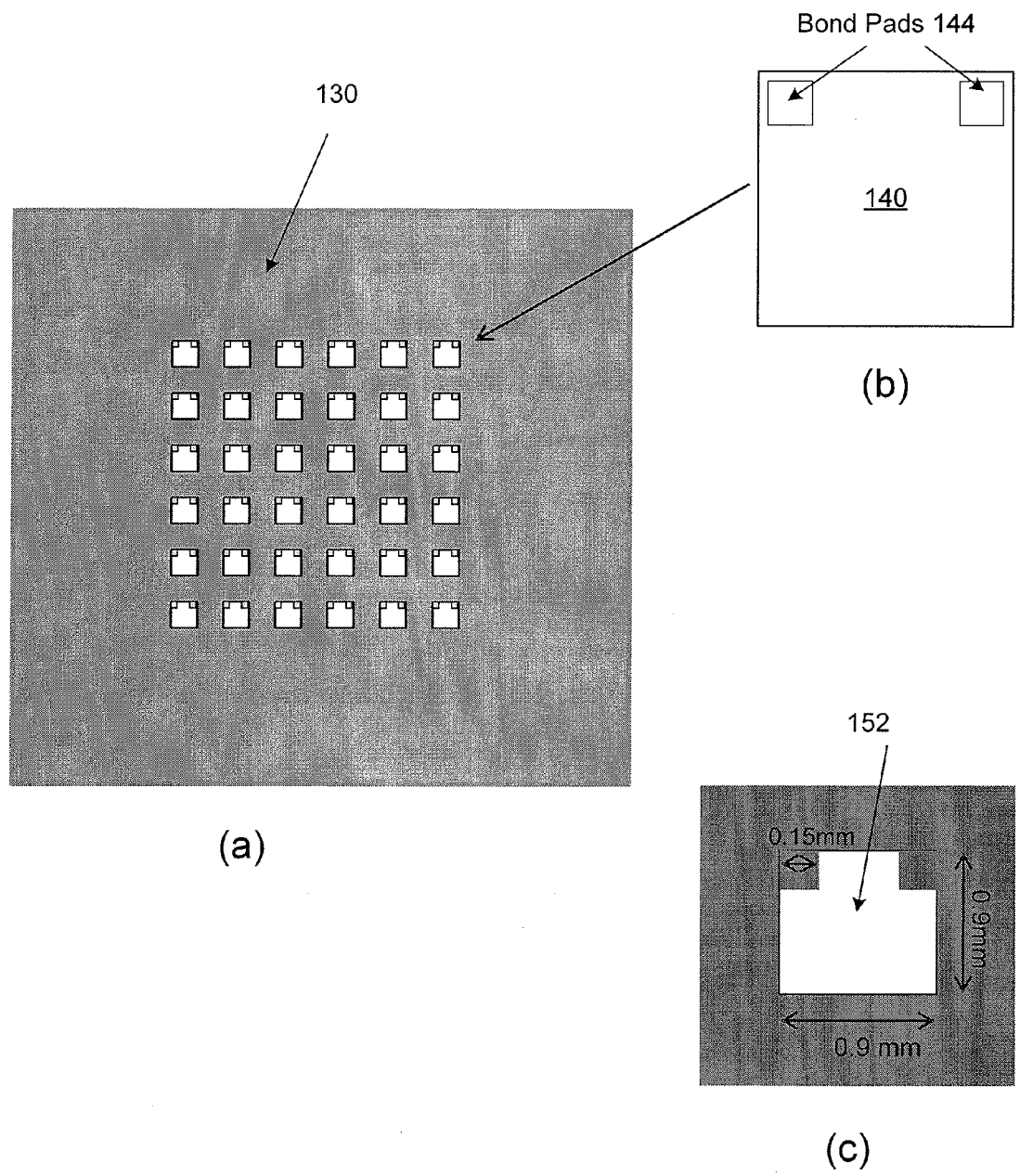

In FIG. 4, individual LED chips 140 are placed into the grid openings. For example, a pick-and-place tool can be used to place individual LED chips into the grid openings, using the grid as fiducia. FIG. 5(a) shows a top view of template 130 with LED chips 140 placed in the openings. FIG. 5(b) shows a top view of an LED chip which includes bond pad areas 144 that will be shielded from the phosphor layer. In embodiments of the invention, a dry film photoresist is used to protect bond pad areas, as described below. FIG. 5 (c) shows a desired pattern for exposing the top surface of an LED chip for phosphor material deposition while protecting the bond pad areas.

Figure 6:
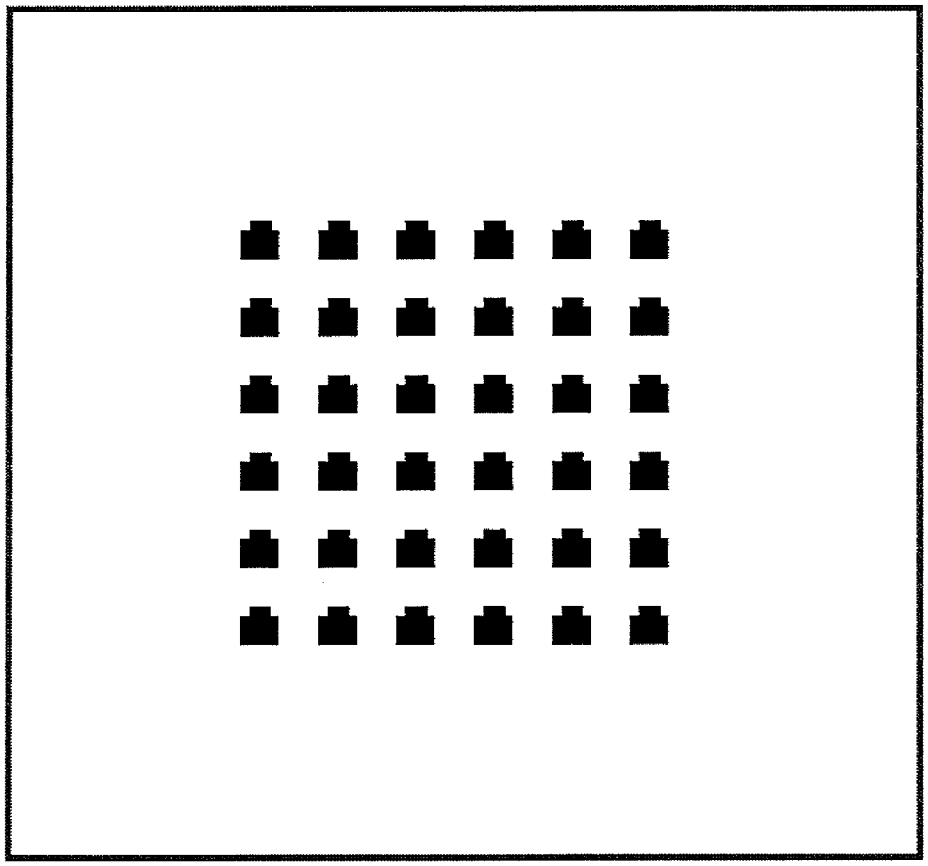

In embodiments of the invention, commercially available dry film photoresist is used to mask out areas in the top surface of the LED dies, such as bond pad areas. For example, the Dupont, Riston series dry film resists have a thickness from 20 um to 100 um. The Dupont resist has negative tone and needs UV light source for lithography. In another example, the 416-DFR dry film resist from MG Chemicals are available thickness from 1.5 to 2 mil. The MG films are also negative tone, but they can use regular daylight fluorescent light bulb for lithography. The dry film photoresist is often sandwiched between two films, a polyethylene film and a polyester film. In a positive tone resist, the area to be removed will be exposed and, therefore, appears as open areas in the mask, as illustrated in FIG. 5(c). For a negative tone resist, the areas to be removed in the mask is dark; an example of such a mask layout is shown in FIG. 6. The mask artwork can be made using computer graphics software, and the artwork can be printed on a transparent film using, e.g., a laser printer.

Figure 7:
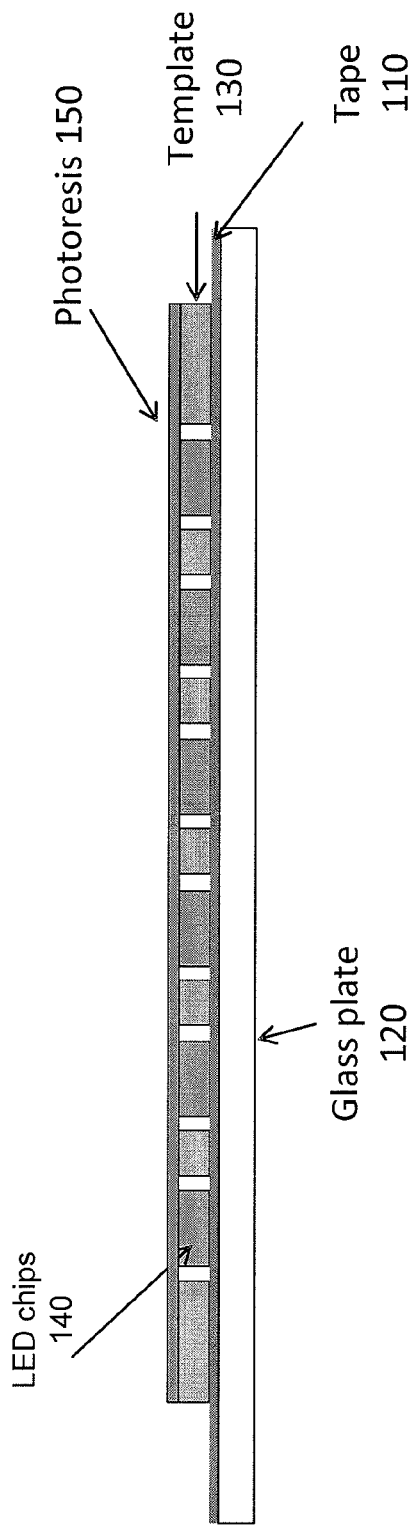

In FIG. 7, after the polyethylene layer is peeled off the dry film resist, the dry film resist 150 is laid over the template 130 with the LED chips 140. The dry film resist is in contact with the LED chips and template. As shown in FIG. 7, the dry resist film can "tent" over the gap between the LED chips and template.

Figure 8:
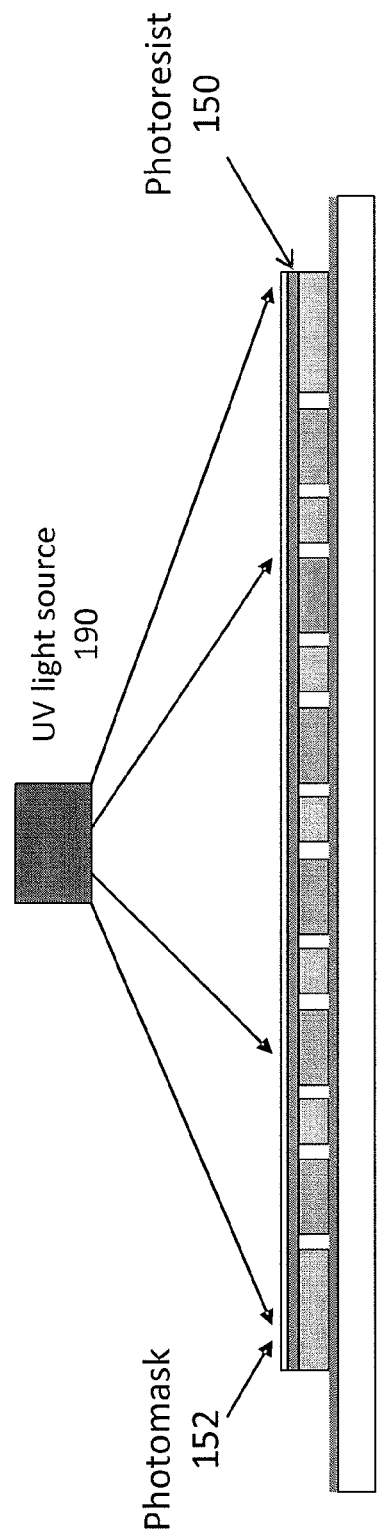
Figure 9:
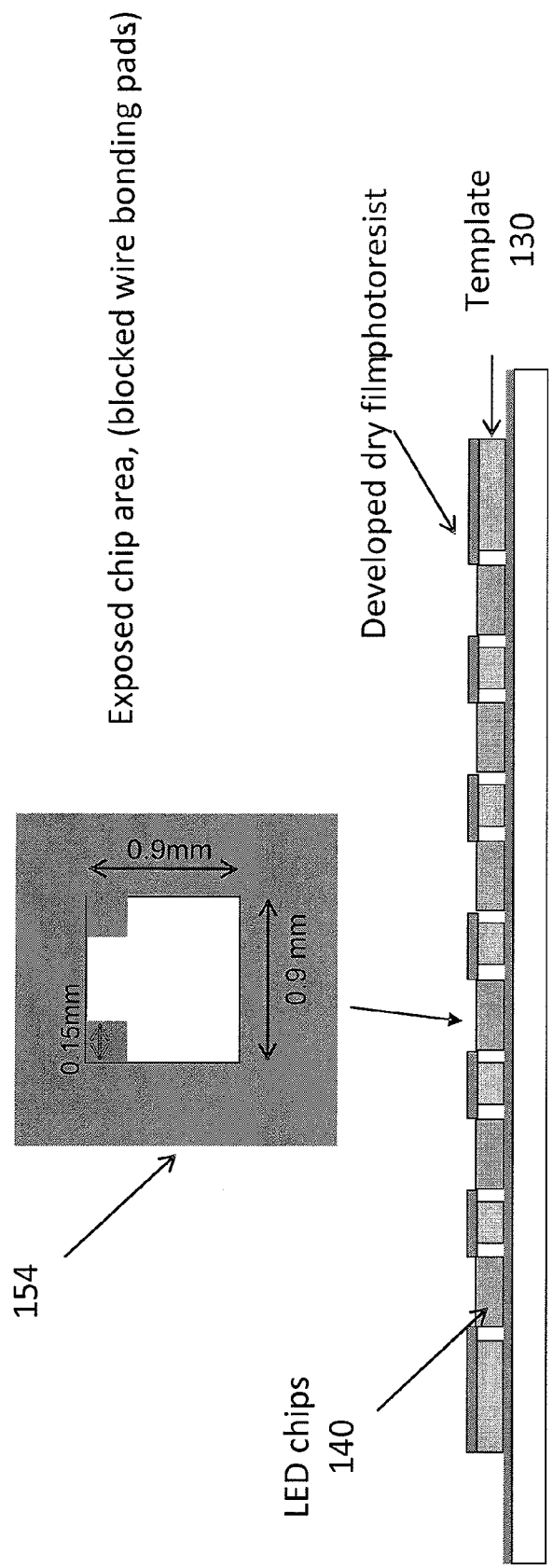

FIG. 8 shows the exposure of the dry resist film. The photo mask 152, with the artwork printed on a transparent film, is disposed over the polyester cover of the dry film resist 150 that has been adhered to the LED chips/template. The ink side of the photo mask is in contact with polyester cover. Next, a UV transparent glass or acrylic plate (not shown) is placed over the top of the photo mark, so that the photo mask can have a smooth and intimate contact with the polyester cover. The exposure can be carried out using a UV light source 190, for example, LED lamp Luxpot alta from LedEngin can provide 400 um UV light. The exposure can be carried out for, e.g., 20 minutes. Subsequently, a post-exposure bake is performed to further assist cross links of the photoresist. The unexposed areas of the photoresist film is removed using a conventional resist development process. At this point, as shown in FIG. 9, the top surface of the LED dies is exposed, except the bond pad areas. The bond pad areas and the rest of the surface of the template are now protected by the developed photoresist, as shown in the top view of a die area 154.

Figure 10:
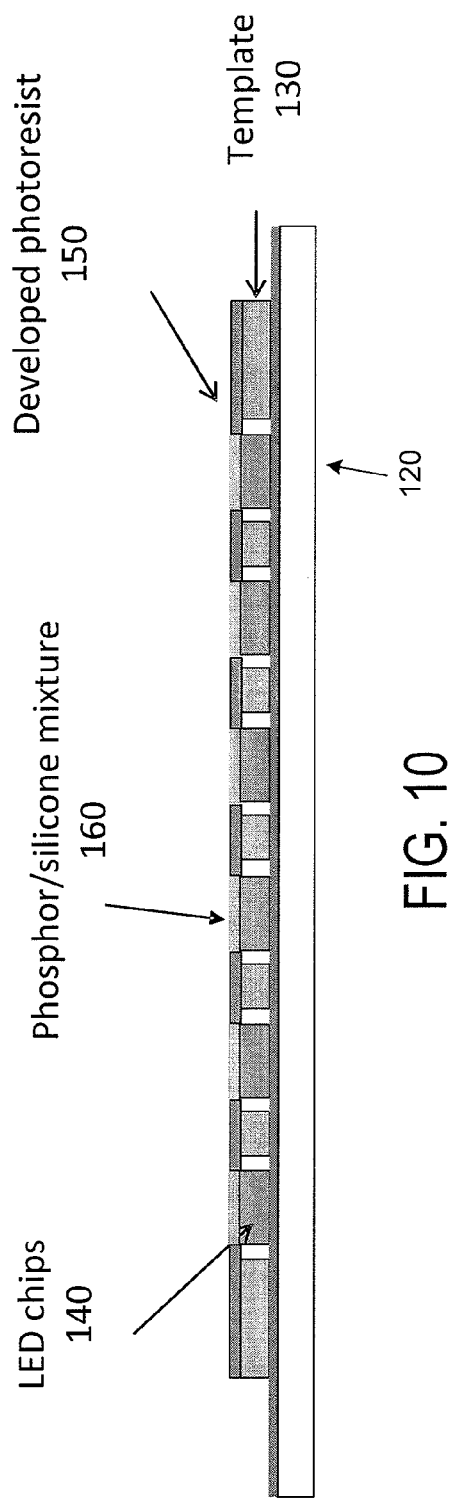

In FIG. 10, a phosphor containing mixture 160 is deposited over the patterned stack. As an example, the mixture can be prepared by mixing silicone (e.g., Ker2500), phosphors (e.g., yellow and red phosphors), and diluting solution (e.g., KF-994, cyclotetrasiloxane) to achieve proper viscosity and thixotropy. Here, the mixture can have a higher viscosity that the mixture used in conventional liquid dispensing methods. Therefore, changes in the phosphor mixture caused by settling can be reduced. After the phosphor mixture is applied, a degas procedure can be used to remove bubbles. The mixture is then rolled over photoresist pattern and print. The printing can be carried out using, e.g., the printing machine from DEK. After printing, excess silicone/phosphor/dilutent mixture is removed from the stencil. The thickness of the photoresist allows a controlled thickness of the phosphor mixture on the die top.

Figure 11:
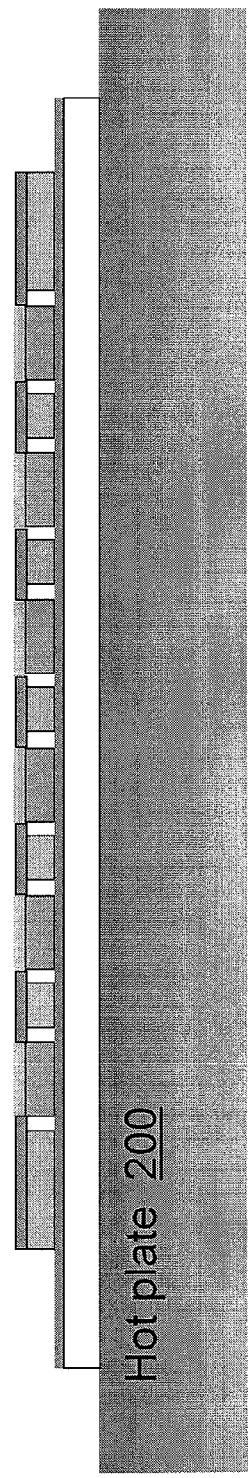

FIG. 11 shows the intermediate structure including a glass plate 120, a template 130 over the plate, LED chips 140 disposed in openings in the template, a photoresist 150 with a phosphor-containing mixture 160 filling the openings in the photoresist and over the exposed top surface of the LED chips. This intermediate structure is placed over a hot plate 200 to cure the silicone at 120-150 C for 2 minutes. During curing, the photoresist is maintained at the printing position so silicone does not flow and cover the wire bond pads, until silicone/phosphor/dilutent mixture is dried.

Figure 12:
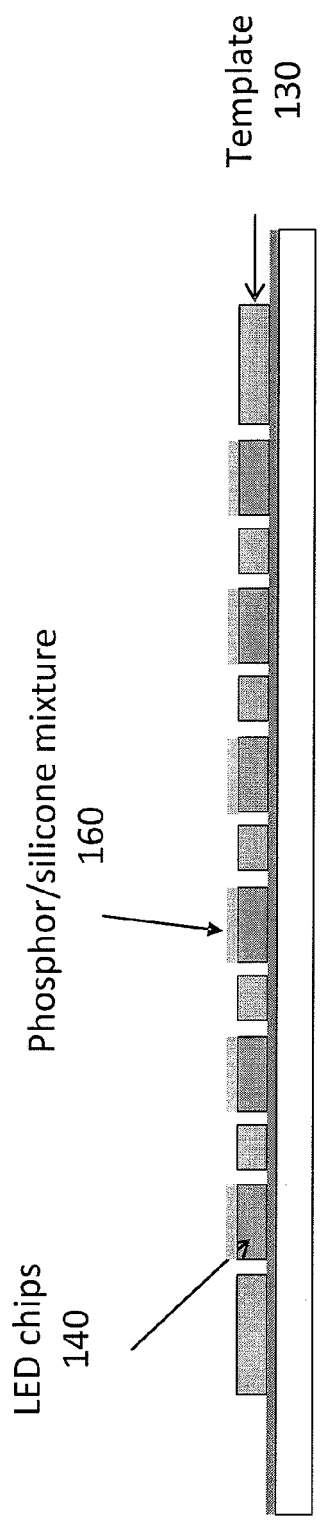
Figure 13:
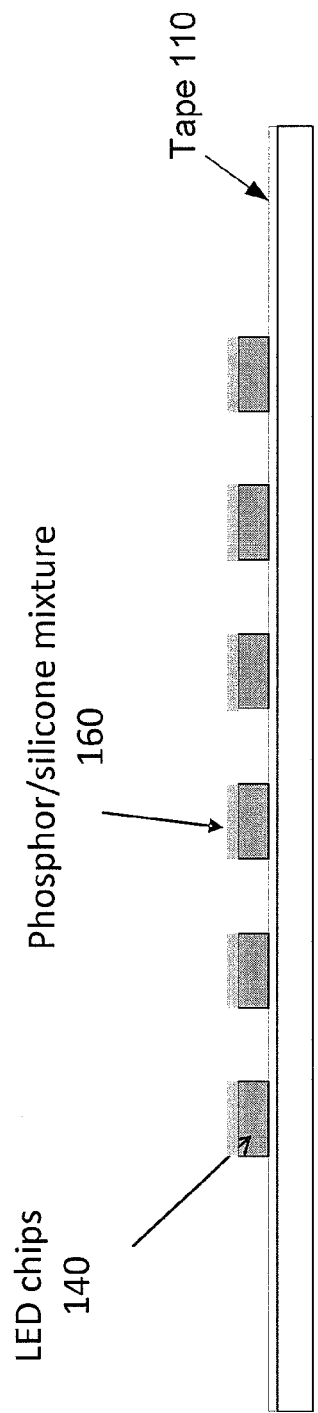

In FIG. 12, the photoresist is removed. Here, a suitable photoresist stripping solution, such as those from Dupont or MG Chemical, can be used. In FIG. 13, the template is removed, and each individual LED die is now covered with a layer of phosphor-containing mixture.

A structure shown in FIG. 13 includes a plurality of separate LED dies 140 attached to an adhesive tape 110, each of the LED dies having a layer of phosphor-containing material 160 on the die top. At this time, a standard assembly process, e.g., using a pick-and-place tool, can be used to install the phosphor-coated LED dies in an emitter package.

Figure 14:
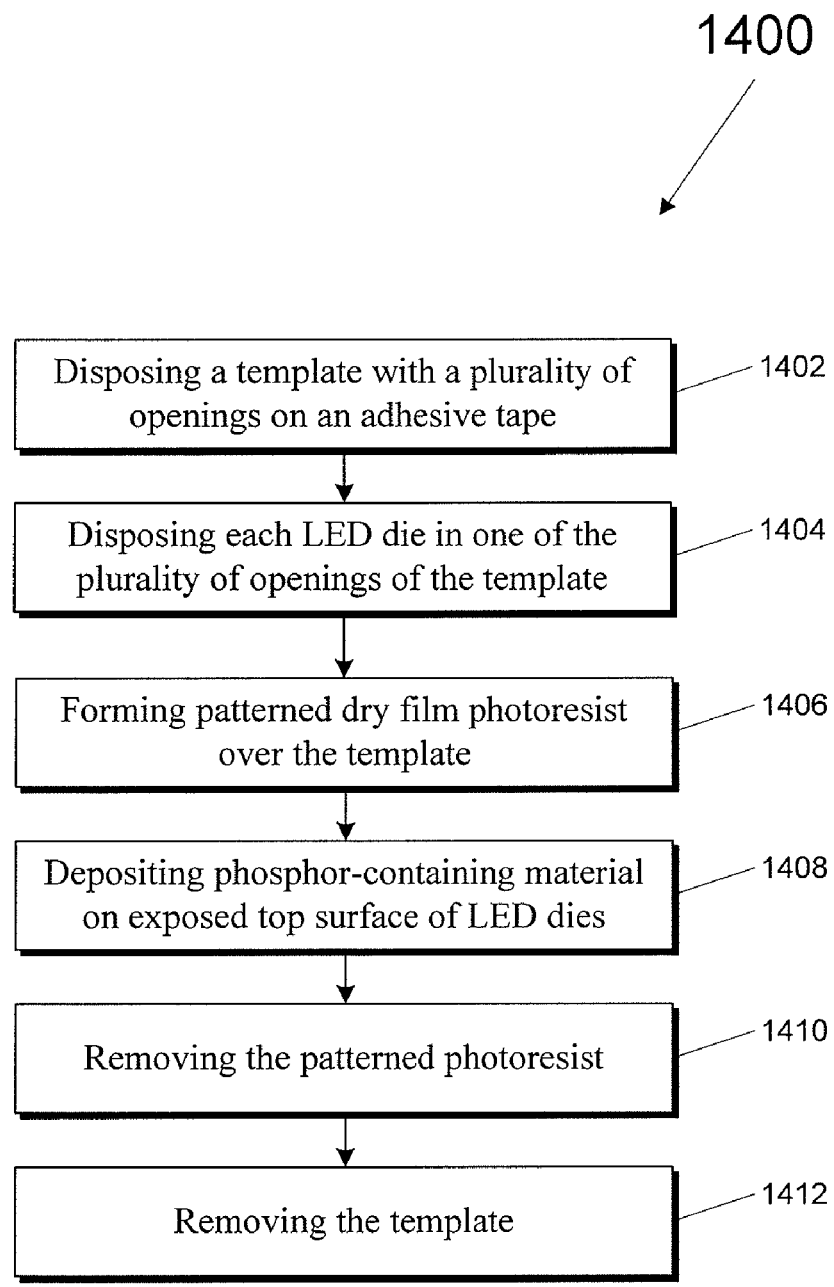
FIG. 14 is a flowchart summarizing the method for depositing a layer of phosphor-containing material on a plurality of LED dies according to an embodiment of the present invention.

FIG. 14 is a flowchart summarizing a method for depositing a layer of phosphor-containing material on a plurality of LED (light-emitting diode) dies according to an embodiment of the present invention. As shown in FIG. 14, the method includes the following processes:

disposing a template with a plurality of openings on an adhesive tape;

disposing each of a plurality of LED dies in one of the plurality of openings of the template;

forming a dry film photoresist layer over the template and the plurality of LED dies, the dry film photoresist layer having a plurality of openings configured to expose a top surface of each of the LED dies;

depositing a phosphor-containing material on the exposed top surface of each the LED dies;

removing the photoresist film; and removing the template.

An example of the method is described above in connection with FIGS. 1-13.

In this method, the process of depositing a phosphor-containing material on the top surface of each the LED dies includes:

depositing the phosphor-containing material on the stencil and the LED dies; and removing phosphor-containing material from the top surface of the dry film photoresist layer and on the top surface of the LED dies that protrudes above the top surface of the template.

The methods described above are suitable for phosphor deposition before the die attach and wire bonding steps for the single color multi-die emitters. In addition, in some embodiments, after phosphor printing, each die is tested for light color. Two or more dies of opposite colors (with respect to the average color of all dies) may be selected and attached in a multi-die package.

Although the invention has been described with respect to specific embodiments, it will be appreciated that the invention is intended to cover all modifications and equivalents within the scope of the following claims.

What is claimed is:

1. A method for depositing a layer of phosphor-containing material on a plurality of LED (light-emitting diode) dies, the method comprising:

disposing a template with a plurality of openings on an adhesive tape;

disposing each of a plurality of LED dies in one of the plurality of openings of the template;

forming a patterned photoresist layer over the template and the plurality of LED dies, the photoresist layer having a plurality of openings configured to expose a top surface of each of the LED dies;

depositing a phosphor-containing material on the exposed top surface of each the LED dies;

removing the photoresist layer; and removing the template.

2. The method of claim 1, wherein the adhesive tape is placed on a glass plate.

3. The method of claim 1, wherein the adhesive tape is a heat release tape.

4. The method of claim 1, wherein the adhesive tape is a UV release tape.

5. The method of claim 1, wherein an area of the openings in the template is approximately equal to the size of the LED dies.

6. The method of claim 1, wherein a thickness of the openings in the template is substantially equal to a thickness of the LED dies.

7. The method of claim 1, wherein the photoresist layer is configured to cover bond pad areas on the LED dies.

8. The method of claim 1, wherein depositing the phosphor-containing material in each of the openings in the stencil comprises:

depositing the phosphor-containing material on the photoresist layer and the LED dies; and removing the phosphor-containing material from the top surface of the photoresist layer and on the top surface of the LED dies that protrudes above the top surface of the stencil.

9. The method of claim 1, wherein a depth of the openings in the photoresist layer is equal to a desired thickness of the phosphor-containing material.

10. The method of claim 1, wherein forming the photoresist layer comprising:

disposing a layer of dry photoresist film over the template;

disposing a mask layer over the photoresist layer; and forming a plurality of openings in the photoresist layer.

* * * * *